United States Patent [19]

Hall et al.

[11] Patent Number: 5,600,273

[45] Date of Patent: Feb. 4, 1997

[54] CONSTANT DELAY LOGIC CIRCUITS AND METHODS

[75] Inventors: David W. Hall, Satellite Beach; J. G. Dooley; Arecio A. Hernandez, both of Melbourne, all of Fla.

[73] Assignee: Harris Corporation, Melbourne, Fla.

[21] Appl. No.: 305,366

[22] Filed: Sep. 13, 1994

Related U.S. Application Data

[63] Continuation-in-part of Ser. No. 292,482, Aug. 18, 1994, Pat. No. 5,514,982.

[51] Int. Cl.⁶ .............................. H03H 11/26; G06F 1/04
[52] U.S. Cl. ........................ 327/261; 327/285; 327/291; 327/295
[58] Field of Search .................................. 327/261, 262, 327/263, 264, 270, 271, 272, 391, 393, 394, 395, 530, 535, 537, 278, 285, 291, 295

[56] References Cited

U.S. PATENT DOCUMENTS

| | | | |
|---|---|---|---|
| 4,494,021 | 1/1985 | Bell et al. | 327/271 |
| 4,645,958 | 2/1987 | Suzuki et al. | 327/278 |
| 4,866,314 | 9/1989 | Traa | 327/278 |
| 5,039,893 | 8/1991 | Tomisawa | 327/394 |
| 5,159,205 | 10/1992 | Gorecki et al. | 327/284 |
| 5,270,586 | 12/1993 | Emori et al. | 327/278 |
| 5,327,031 | 7/1994 | Marbot et al. | 327/278 |
| 5,352,945 | 10/1994 | Casper et al. | 327/262 |

OTHER PUBLICATIONS

P. R. Gray & R. G. Meyer, "Analog Integrated Circuits", 2nd Ed., John E. Wiley & Sons, pp. 61–70, 1984, New York.
A. S. Grove, "Physics and Technology of Semiconductor Devices", John E. Wiley & Sons, pp. 321–329, 1967, New York.
F. Gardner, "Phase Lock Techniques", 2nd Ed., John E. Wiley & Sons, pp. 8–16 & 121–125, 1966, New York.

*Primary Examiner*—David C. Nelms
*Assistant Examiner*—Trong Phan
*Attorney, Agent, or Firm*—Nixon, Hargrave, Devans & Doyle

[57] ABSTRACT

A partitioned constant delay logic network 208 has a number of constant delay logic elements. The delay of each logic element is held constant by applying a controlled bias voltage, $V_{bias}$. The source of the controlled bias voltage is a phase locked loop 201 which has a voltage controlled oscillator 203 constructed out of an odd plurality of constant delay logic elements.

12 Claims, 5 Drawing Sheets

CONSTANT DELAY LOGIC CIRCUITS AND METHODS

GOVERNMENT INTEREST

This invention was made under Contract No. MDA-904-92-C-5101 with the Department of Defense.

RELATED APPLICATIONS

This application is a continuation in part of our earlier application, Ser. No. 08/292,482, filed Aug. 18, 1994, now U.S. Pat. No. 5,514,982 and entitled LOW NOISE LOGIC ELEMENT, the entire disclosure of which is hereby incorporated by reference.

This invention related to logic devices, and, in particular, to a family of logic devices that has a constant delay that is programmable to a one or more delay times.

BACKGROUND

Timing is an important feature in electronic circuits and systems. Digital computers rely upon clock signals to sequentially execute instructions. Digital computers and microprocessors use one or more clock signals to establish the time for each function including receiving data, sending data, and executing arithmetic and logical functions. It is an essential feature of digital computers and microprocessors that such functions be executed in a timed, sequential manner and so it is very important that such clock signals be stable.

Electronic components such as analog to digital converters also rely on a series of clock signals that are delayed a known time with respect to each other. Such A/D converters rely upon an initial clock signal to auto zero, a second clock signal delayed from the first signal to capture data, and the third clock signal delayed from the second clock signal to output the digital representation of the captured data.

Often electronic systems will require fixed or adjustable delay lines. See, for example, U.S. Pat. No. 5,252,867. There is described a programmable digital delay line that could be used as a part of the refresh circuitry of a dynamic random access memory (DRAM).

Mass storage memory devices such as compact disc memories, magnetic disc memories and magnetic drum memories may rely upon a combination of a clock and a delay line in order to read and to write data on the rotating memory storage medium. Each device divides its storage medium into cells. As the device rotates at a constant speed, the data in each cell can be thought of as stored in cells that are a known time delay with respect to the prior cell and the subsequent cell. As such, a constant delay line may be used to read data or write data into each cell.

In certain applications including secure communications it is desirable to reduce switching noise. Switching noise can be monitored and contains information about the data carried and switched by the circuit. One approach for reducing the digital switching noise has been developed by Allstot, Kiaei and Zele, "Analog Logic Techniques Steer Around the Noise," IEEE Journal of Circuits & Devices, pp 18–21, September 1993. That approach uses a current steering technique that draws constant current from Vdd. The current that is dumped on the Vss distribution will see a transient current that is device parameter limited as the input transitions to a logical "1." The Iss transient may be used to determine the current-steering logic elements state level.

SUMMARY

This invention is based in part on our discovery that when a logic element is provided with a constant current the logic element uses that current whether or not the logic element is switching and the noise attributable to logic transitions is very small and almost undetectable. The LNL family provides a design for logical switching elements that operate under a constant current. It was discovered that the LNL family has another important characteristic: constant delay. The propagation delay of a LNL circuit is inversely proportional the magnitude of the bias current and, in particular to the square root of the magnitude of the bias current. Such a relationship provides a means to fix the delay of all LNL in a circuit to be a function of the bias voltage. In addition, the bias source itself can be constructed out of LNL elements where the LNL elements are inverters in a ring oscillator that is part of a phase locked loop (PLL). The PLL is part of a larger integrated circuit that carries CMOS and/or bipolar devices and LNL elements that are partitioned from the PLL.

The phase locked loop has a voltage controlled oscillator (VCO) in the form of an odd number of LNL inverters. The frequency of the VCO is determined by the bias voltage applied to the inverters. The combined delays of the inverters provide the frequency of the output signal of the VCO. The VCO output is compared to a reference oscillator, such as a crystal oscillator, by a phase comparator. The phase comparator provides its output signal to a filter. The filter supplies an output bias voltage that is applied to the inverters of the ring oscillator. The same output voltage is applied to other LNL elements that are partitioned from the PLL.

The rising and falling delay times of each inverter in the ring oscillator determine the average delay and thereby sets the frequency of the ring oscillator. Those delay times are determined by the current. Larger currents have less delay. The current is determined by the applied voltage bias. So, switching time is inversely proportional to current. In the PLL the VCO is a ring oscillator whose frequency is compared to a reference frequency. The PLL will produce a bias voltage that is sufficient to lock the frequency of the ring oscillator to the frequency of the reference oscillator. As such the output of the filter will be a bias voltage that can be applied to the partitioned LNL elements so that all the LNL elements operate with a constant delay. The PLL results in enough of an output voltage at the filter output to operate the ring oscillator at a frequency that matches the reference oscillator. That means that each cell of the oscillator will have the applied voltage bias that is necessary to control the delay so that the oscillator period corresponds to the period of the reference voltage. In one embodiment of the invention, the ring oscillator has a three phase clock output.

DETAILED DESCRIPTION

Low Noise Logic (LNL) elements are shown and described in our copending application Ser. No. 08/292,482, filed Aug. 18, 1994. LNL reduces digital noise on the Vss (ground) bus by as much as 66 dB and on the Vdd (+5 Volts) bus by more than 56 dB. The primary technique used by LNL to reduce switching noise is operation with a constant current so that the inductance of the IC distribution, bond wire and package trace would not produce an appreciable voltage due to the product of the inductance and the rate of change of current with respect to time. The logical input to an LNL element does not capacitively couple directly to Vss. LNL complements CMOS logic in specific applications and is intended to be used in combination with CMOS. LNL is especially useful in mixed signal and controlled delay applications and in applications requiring reduced levels of interfering signals radiated or conducted from the partition or the IC.

Figure 1A:
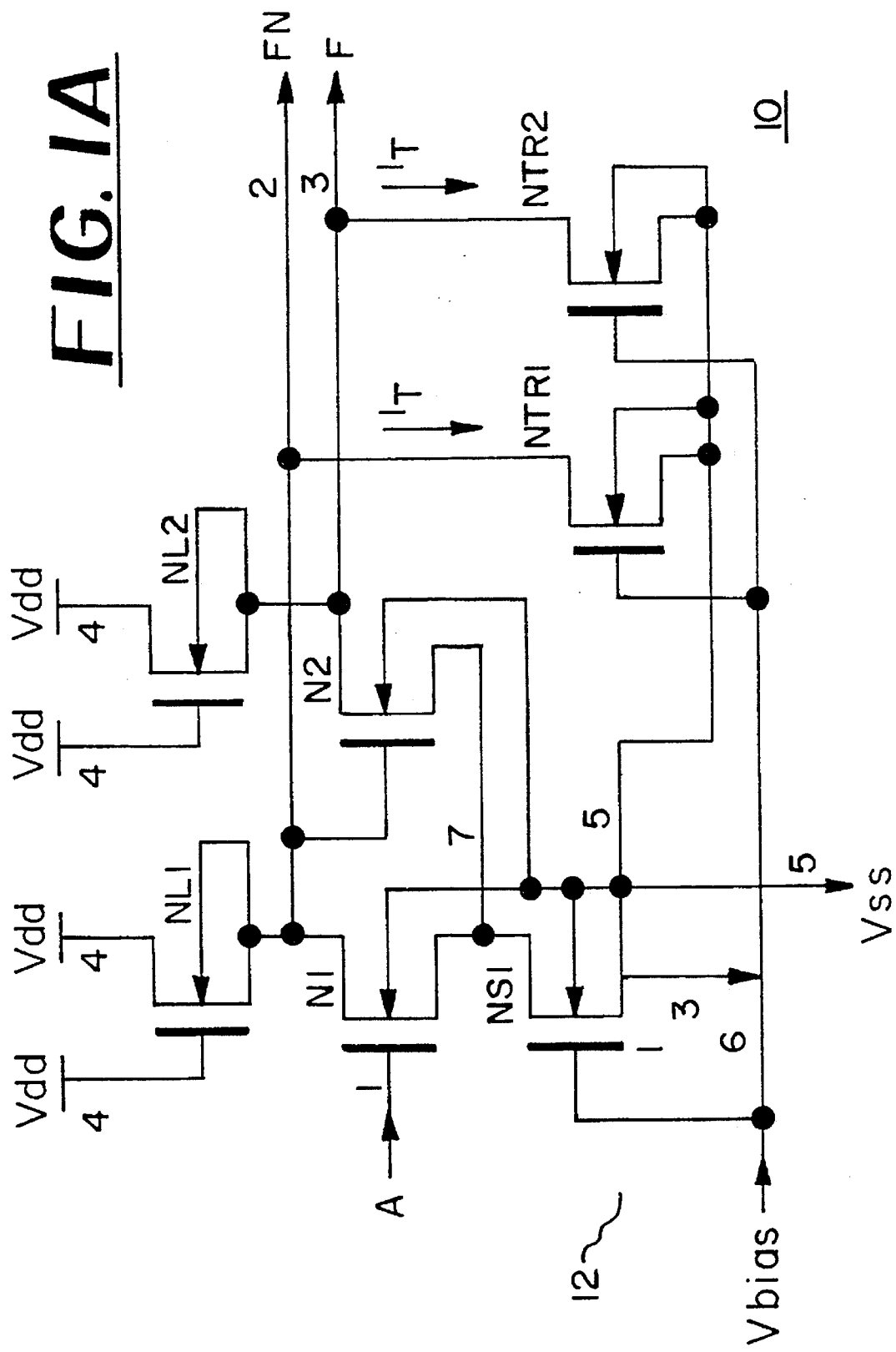
FIG. 1A is a schematic drawing of an LNL inverter.

With reference to FIG. 1A, the LNL family includes a basic logic circuit, such as an NMOS inverter 10. The inverter 10 has a first (high) reference voltage source $V_{dd}$ coupled to a pair of load devices NL1 and NL2. The load devices NL1, NL2 are nonlinear loads devices, typically each a NMOS transistor with its drain and gate coupled to $V_{dd}$. As such, each of the devices NL1,NL2 is predetermined voltage drop below $V_{dd}$. Load device NL1 is coupled to the drain or input terminal of first switching NMOS transistor N1. An input logic signal at input terminal A is coupled to the gate of N1. The second load device NL2 is coupled to the drain of a second NMOS switching transistor N2. The gate of N2 is also coupled to the drain of N1. The sources of N1 and N2 switching transistors are coupled to a constant current source 12. The constant current source 12 includes NMOS transistor NS1 with its gate connected to a voltage source $V_{BIAS}$ and its source coupled to a second reference voltage, Vss or ground. The constant current source 12 is kept at its constant current $I_B$ by a control voltage $V_{BIAS}$. The drain terminal of the second switching transistor N2 is coupled to true output terminal F and provides a true output signal that matches the logic state of the input logic signal on input terminal A. The drain terminal of the first switching transistor N1 provides a complementary output signal on output terminal FN. The complementary output signal is the opposite logical state of the input logic signal.

For a high or 1 input logic signal the first switching transistor N1 is on and steers the constant current $I_B$ to the first load device NL1 and couples the first switching transistor N1 to the output of the constant current source 12. The gate electrode of the second switching transistor N2 is also coupled to the drain of the first switching transistor N1. The input levels of the gate electrode of N2 are controlled by the voltage drop of the non-linear load device NL1 as NL1 conducts the current steered to NL1 by N1. The voltage on the gate of N2 turns the second switching transistor N2 off. With N2 off the voltage level at output F rises to a high voltage (1) at the output of NL2. The complementary output FN is coupled via N1 to NS1 and has a low logic level (0). The drain of N2 is at the same voltage as the second load device NL2 which is a predetermined voltage drop below $V_{dd}$. The true output F of the inverter 10, coupled to the drain of N2, has a high voltage level corresponding to a logical 1.

When the input logic signal changes state to a low or logic level (0), the first switching transistor N1 turns off and its drain rises to a high voltage, i.e. a voltage that is a predetermined voltage drop below $V_{dd}$. That high voltage corresponds to a logical 1 and appears on the complementary output FN that is coupled to the drain of N1. The gate electrode of N2, being coupled to the high voltage on the drain of N1, turns on N2. N2 steers current from the constant current source 12 to NL2. So, the true output F of the inverter 10 is low or 0.

The trickle current devices NTR1, NTR2 drain enough current from each of NL1 and NL2 to ensure that each transistor N1, N2 will remain below $V_{dd}$ when either switching transistor N1,N2 is off. It is recognized that the NMOS switching transistors N1, N2 will have some leakage current. It is necessary to provide a trickle current greater than the leakage currents of NL1, NL2 to ensure that the gate electrode of N2 is not carried above a valid high level at the output of NL1 such that the gate electrode of N1 would have no influence on the activity of N1. Without a trickle current, over time the leakage current in NL1 or NL2 would gradually allow the drain terminal of N1 or N2 to rise to the level of $V_{dd}$.

NTR1 and NTR2 keep a small trickle current (relative to $I_B$) flowing in the load device NL1, NL2 that is outputting a 1. Without NTR1, the FN output might rise to Vdd through leakage currents in NL1 being greater than leakage currents in N1. In this condition, logic signals at input A could not be guaranteed to control the states of F and FN. This is a problem at low frequencies where FN might be left in the 1 state long enough for FN to slowly reach Vdd. Since this is a low frequency problem it is possible that testing the unit in a production environment might not reveal the failure. The current provided by NTR1 is sufficiently greater than the leakage current of NL1 to ensure that the output states of N1 and N2 can be controlled by the input A.

The channel length of NS1 is 2.2 μm instead of the process supported minimum channel length of 1.2 μm. The use of a 2.2 μm channel length increases the DRAIN to SOURCE resistance of NS1, which provides additional isolation of switching noise to Vss. NL1 and NL2 are non-linear loads that have their Pwells tied to their SOURCEs. N1, N2 and N3 steer the bias current developed by NS1 to the SOURCE of either NL1 or NL2 depending on the state of the inputs A and B.

Figure 1B:
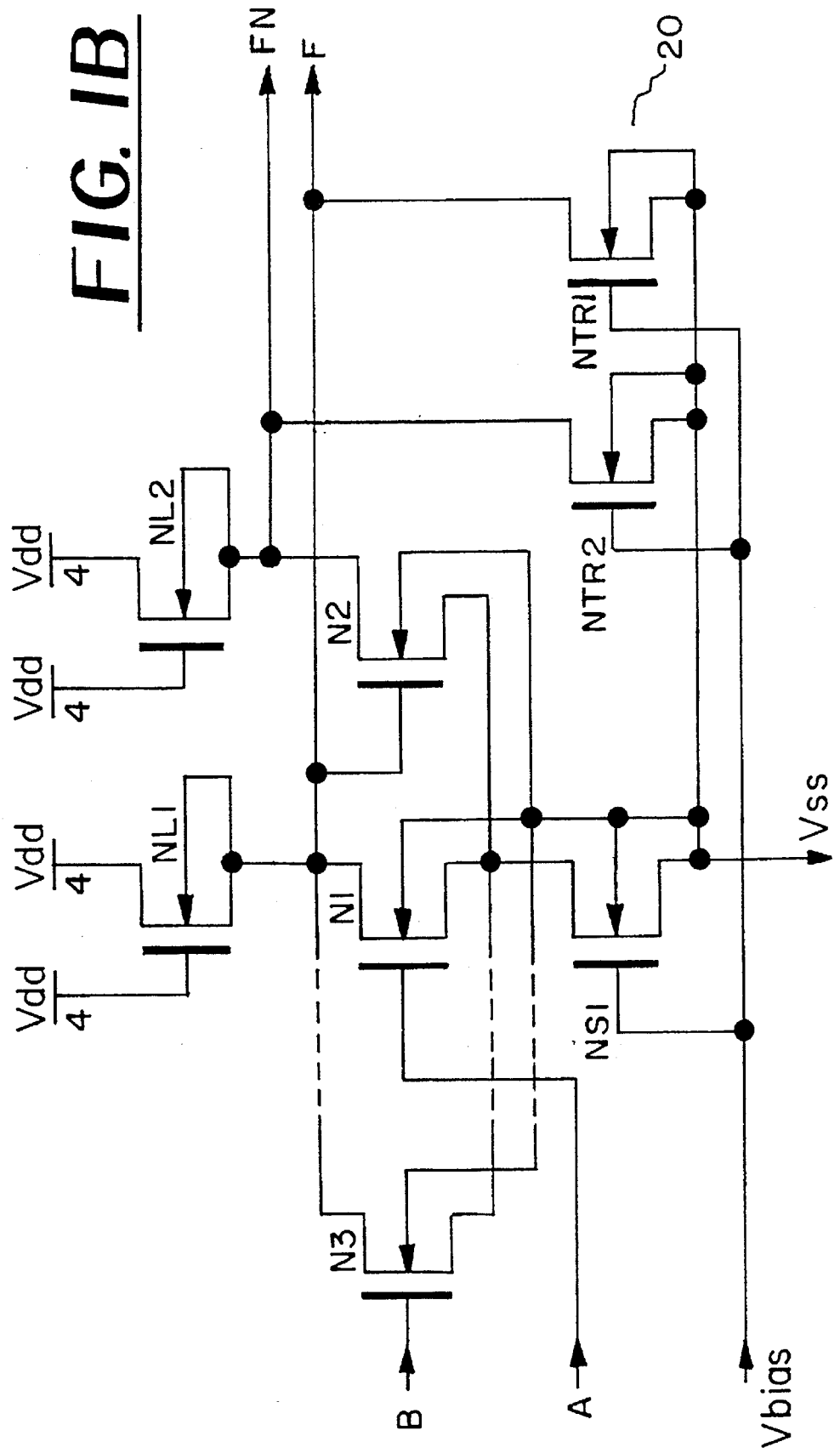
FIG. 1B is a LNL nor/or gate.

With reference to FIG. 1B the inclusion of N3 in FIG. 1A produces a 2-Input NOR/OR gate 20. If N3 were not present, the function would be an Inverter/Buffer. The design provides that the voltage difference between logic states at the output is greater than that voltage required at an input to fully switch the current from one non-linear output to the other. If this constraint is not satisfied, the propagating signal may vanish after progressing through several stages of logic. NTR1 and NTR2 are used to lower the output impedance at the output "1" level and to insure operation when a microplasma, induced by an iron, copper, etc., impurity, exists in the proximity of NL1. The output FN "1" level will not go to Vdd even if NL1 has significantly more leakage than N1 or N3 since NL1 is prohibited from turning completely OFF by NTR1. If FN had been allowed to approach Vdd, the logical inputs might not be able to control the state of either the FN or the F output.

The inverter 10 has the following characteristic equations defining its operation:

$$Voh \cong Vdd - \sqrt{\frac{(I_{DS\_NTR1})*L_{\mathit{eff}\_NL1}}{k'*W_{NL1}}} - V_{t0} \tag{1}$$

-continued $$Vol \cong Vdd - \sqrt{\frac{(I_{DS\_NS1} + I_{DS\_NTR1})*L_{eff\_NL1}}{k'*W_{NL1}}} - V_{t0} \quad (2)$$

$$R_{OUT\_1} \cong \frac{1}{2} * \sqrt{\frac{L_{eff\_NL1}}{k'*W_{NL1}*I_{DS\_NTR1}}} \quad (3)$$

$$R_{OUT\_0} \cong \frac{1}{2} * \sqrt{\frac{L_{eff\_NL1}}{k'*W_{NL1}*(I_{DS\_NS1} + I_{DS\_NTR1})}} \quad (4)$$

where $I_{DS}$ is DRAIN to SOURCE current, P. R. Gray & R. G. Meyer, "ANALOG INTEGRATED CIRCUITS," 2nd Ed., John Wiley & Sons, New York, 1984, pp. 61–70. $L_{eff\_NL1}$ is the effective channel length of NL1, k' is the MOS gain constant ($=\mu*C_{ox}/2$), $\mu$ is mobility, $C_{ox}$ is GATE capacitance per unit area, $W_{NL1}$ is the channel width of NL1 and $V_{t0}$ is the N channel threshold voltage. A. S. Grove, "PHYSICS AND TECHNOLOGY OF SEMICONDUCTOR DEVICES," John Wiley & sons, New York, 1967 pp. 321–329.

The nominal value for the bias current used by a simple LNL cell was fixed at 32 μA to support a 5000 equivalent gates per Watt capability. At this value of bias current, a performance rating of 25 MHz has been accomplished when tested as a shift register with three stages of LNL elements inserted between each Flip-Flop. The transition between states may be approximated by the following two relationships.

$$\text{Rising Charactistic} \cong Vdd - V_{t0} + \left(\frac{C_L*L_{eff}}{2*k'*W*t}\right) + \ldots \quad (5)$$

$$-\sqrt{\left(\frac{C_L*L_{eff}}{k'*W*t}\right)*\sqrt{\frac{L_{eff}*(I_{DS\_NS1} + I_{DS\_NTR1})}{k'*W}} + \left(\frac{L_{eff}*I_{DS\_NTR1}}{k'*W}\right) + \left(\frac{C_L*L_{eff}}{2*k'*W*t}\right)^2}$$

$$\text{Falling Charactistic} \cong Vdd - V_{t0} + \left(\frac{C_L*L_{eff}}{2*k'*W*t}\right) + \ldots \quad (6)$$

$$-\sqrt{\left(\frac{C_L*L_{eff}}{k'*W*t}\right)*\sqrt{\frac{L_{eff}*I_{DS\_NS1}}{k'*W}} + \left(\frac{L_{eff}*(I_{DS\_NS1} + I_{DS\_NTR1})}{k'*W}\right) + \left(\frac{C_L*L_{eff}}{2*k'*W*t}\right)^2}$$

Where $C_L$ is load capacitance, including self capacitance, W is the channel width of NL1 and $L_{eff}$ is the effective channel length of NL1.

The propagation delay of LNL is inversely proportional to the square root of the magnitude of the bias current. The relationships of propagation delay to bias current provides the feature of controlled delay. The noise coupled onto the power and ground distribution systems is proportional the magnitude of the bias current. As bias current increases, noise on Vdd and Vss increases and propagation delay decreases.

$$\text{delay}|_{Ibias} \cong [\text{delay}|_{Ibias=32\mu A}] * \left[\frac{\sqrt{32\mu A}}{\sqrt{Ibias}}\right] \quad (7)$$

$$Ibias \cong \left(\frac{k'*W_{NS1}}{L_{eff\_NS1}}\right) * (Vbias - V_{t0})^2 \quad (8)$$

so that delay as a function of Vbias may be written as $$\text{delay}|_{Vbias} \cong [\text{delay}|_{Ibias=32\mu A}] * \left[\frac{\sqrt{32\mu A}}{(Vbias - V_{t0})*\sqrt{\frac{k'*W_{NS1}}{L_{eff\_NS1}}}}\right] \quad (9)$$

With delay established as a function of Vbias (the GATE to SOURCE voltage appearing at NS1), the design of a Vbias supply that will force delay to be constant over the operating environment may proceed.

Figure 2:
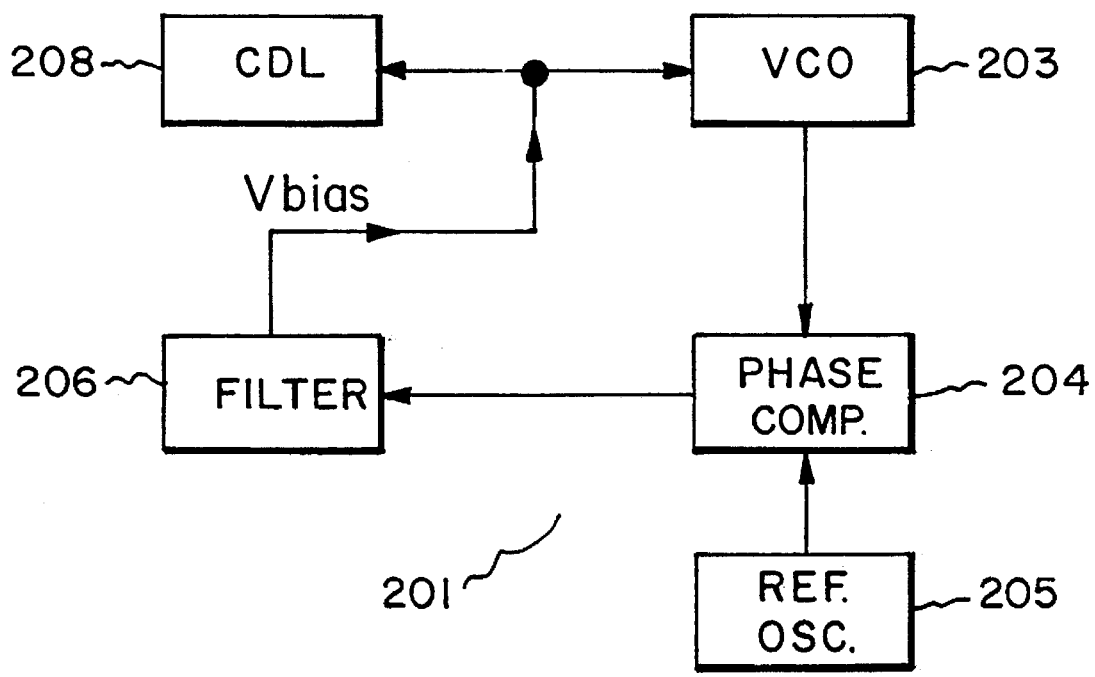
FIG. 2 is a block diagram of a phase locked loop providing a reference bias source for constant delay logic.

Turning to FIG. 2 there is shown a block diagram of PLL 201 and a partitioned constant delay logic circuit 208. The PLL 201 has a VCO 203 coupled to a phase comparator 204. A reference oscillator 205 provides a voltage signal of known frequency to the phase comparator 204. The phase comparator output is coupled to a filter 206 which is coupled to a VCO 203 and the constant delay logic partition 208. The output of the filter 206 provides a signal Vbias. The signal Vbias is coupled to a partitioned constant delay logic network 208 and to the VCO 203. The VCO 203 comprises an odd number (n) of LNL inverters 10 and has a frequency described by equation 10

$$\text{frequency} \cong \left[\frac{V_{bias} - V_{t0}}{V_{bias0} - V_{t0}}\right] * \left[\frac{1}{n*(t_{PD1} + t_{PD0})|_{V_{bias0}}}\right] \quad (10)$$

where $T_{PD1}$ and $t_{PD0}$ are the rising and falling delays respectively of LNL elements in the ring oscillator.

By varying the magnitude of Vbias, the frequency of the LNL ring oscillator may be predictably altered (refer to equation 11).

$$\frac{\partial \text{frequency}}{\partial V_{bias}} = \frac{1}{n*(V_{bias0} - V_{t0})*(t_{PD1} + t_{PD0})|_{V_{bias0}}} \quad (11)$$

where $t_{PD0}$ and $t_{PD1}$ are the nominal values associated with $V_{bias0}$.

Note that equation 11 establishes that the gain of the VCO 203 is a linear relationship between Vbias and VCO frequency. The Vbias value is controlled so that the VCO 203 maintains a constant phase relationship with a reference oscillator frequency provided from a master clock or other frequency source. This relationship provides a delay through each pair of LNL elements in the VCO 203 that will remain constant with operating voltage and temperature and with semiconductor process parameter variations.

The constant logic delay LNL 208 partition, of FIG. 2, has a first plurality of logic elements and operates with a constant delay for each logic element while it receives its Vbias supply from a PLL Vbias 201 generator residing on the same monolithic IC.

The open loop gain of the PLL 201 is described in the literature as is illustrated in equation 12. Id.

$$\text{Open Loop Gain} = G(s) = K_d * \frac{K_0}{s} * F(s) \quad (12)$$

$$K_d = \frac{Vdd - Vss}{2*\pi} \text{ Volts/Radian} \quad (13)$$

$$K_0 = \frac{\partial \omega}{\partial Vbias} \cong \frac{2*\pi}{n*(V_{bias0} - V_{t0})*(t_{PD1} + t_{PD0})|_{Vbias0}} \quad (14)$$

where $K_d$ is the gain constant of the phase detector 204, $K_0$ is the gain constant of the VCO 203, 1/s represents an integration that occurs during the sampling process, F(s) is the transfer characteristic of a compensation network (refer to FIG. 3), Vdd is the positive power supply referenced to Vss (which is ground) and $t_{PD1}$ and $t_{PD0}$ are the rising and falling delays respectively.

Figure 3:
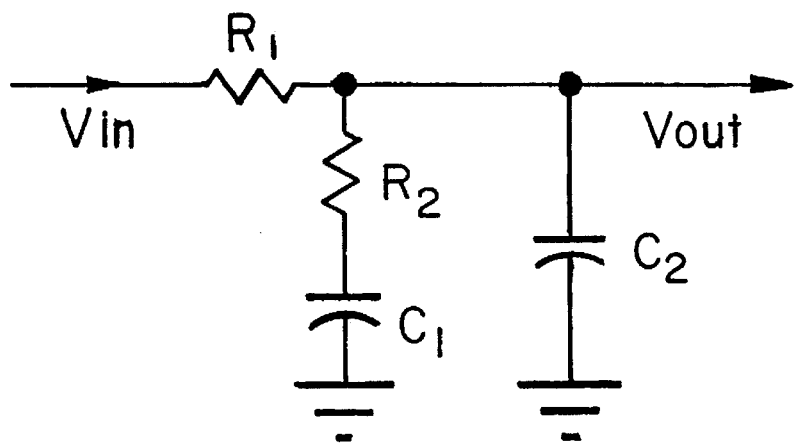
FIG. 3 is a schematic drawing of a passive compensation network (lead/lag) filter.

In order for the PLL 201 to be a stable control system, the pole and zero set of the loop characteristic usually need to be modified. The standard and most straightforward technique is to use a compensation network to make the pole/zero adjustment. FIG. 3 is an example of a lead/lag filter 206 that is a totally passive approach to loop compensation. The filter 206 insures that the open loop gain falls to less than unity before in-phase feedback occurs. The transfer characteristic of the lead/lag filter 206 is provided in equation 15 Equation 16 restates the open loop gain of the PLL 201 with the term F(jω) expanded. The lead/lag filter 206 has an extra capacitor $C_2$ which represents the load capacitance that Vbias is likely to encounter.

$$F(j\omega) = \frac{1 + j\omega*R_2*C_1}{-[\omega^2*R_1*R_2*C_1*C_2 - j\omega*(R_1*C_1 + R_1*C_2 + R_2*C_1) - 1]} \quad (15)$$

$$G(j\omega) = \frac{K_d*K_0*(1 + j\omega*R_2*C_1)}{-j\omega*[\omega^2*R_1*R_2*C_1*C_2 - j\omega*(R_1*C_1 + R_1*C_2 + R_2*C_1) - 1]} \quad (16)$$

In FIG. 2, Vbias is the control voltage that maintains the VCO frequency equal to the reference oscillator frequency. When this Vbias is provided to a logic partition consisting of LNL elements, the propagation delay of the LNL elements (in that partition on a common monolithic structure) will not vary with operating voltage, temperature or semiconductor process variables. LNL elements driving different output loads will have different delays, however; those delays will remain constant with varying operating voltage and temperature.

Values of $R_1$, $R_2$ and $C_1$ must be determined so that the PLL 201 will be able to phase lock to the reference oscillator 204 frequency while producing a minimum amount of phase jitter. $R_1$ is set to 10× the output resistance of the phase comparator 204 in order for the output resistance of the phase comparator 204 to not significantly change the characteristic of the filter 206. A critical damping factor (ζ) is used to avoid any overshoot in the error response. When critically damped, the value of ζ is 0.7071.

$$\zeta = \frac{1}{2} \left( R_2 C_1 + \frac{1}{K_0 K_d} \right) \sqrt{\frac{K_0 K_d}{(R_1 + R_2) C_1}} \quad (17)$$

$$R_1 \geq 10 R_{out\_Phase\ Det} \quad (18)$$

Here $C_2$ is neglected because its influence appears well after the unity gain point of the open loop response in typical PLL systems.

In this application, phase relationship is unimportant, as long as it remains reasonably constant. The goal is to frequency lock, which determines the delay of each LNL member of the VCO.

The control voltage used to control the frequency of the VCO 203 is used as Vbias for a constant delay LNL partition 208. The logic delay of LNL elements existing within this partition will exhibit fixed delays with varying Vdd, temperature and even varying process parameters. The range of delay time performance, which may be as much as 5× from fastest to slowest, in standard logic, is within a few percent of the nominal delay when using constant delay logic. In many cases, logic design has required a logic overhead to protect against delay uncertainties. Using the constant delay technique, a logic design may be more straightforward and will not require exotic logic techniques to protect the logical objective.

In operation, the phase comparator 204 compares the frequency of the output of VCO 203 with the frequency of the reference oscillator 205. The output of the phase comparator 204 is applied to filter 206. Filter 206 outputs a signal representative of the $V_{bias}$ value required to maintain a small constant phase difference between VCO 203 and the reference oscillator 205. $V_{bias}$ is applied as the reference voltage $V_{bias}$ to the VCO 203 and to partitioned constant delay logic 208. The VCO 203 includes odd number of LNL inverters 10.

Figure 4:
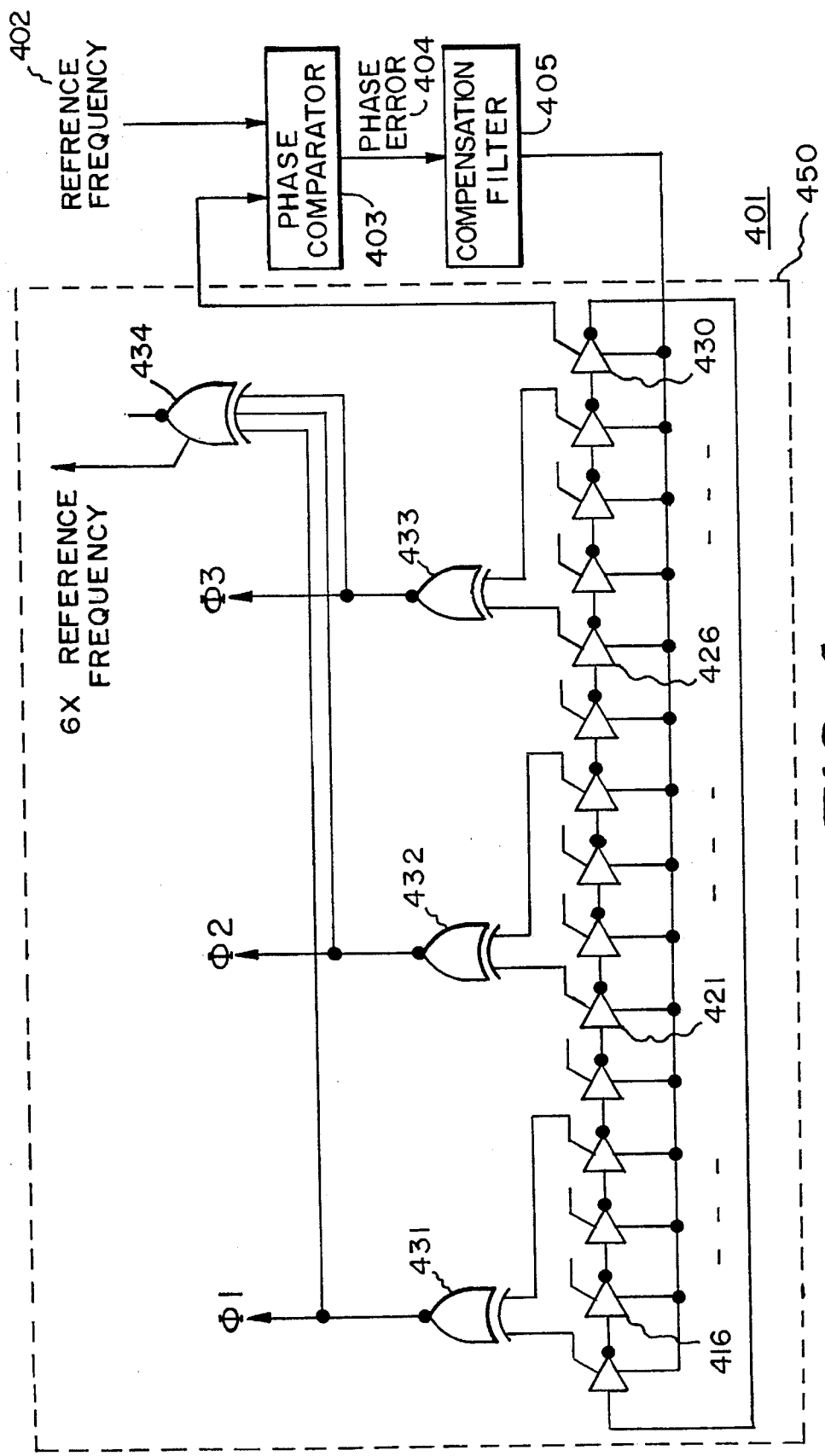
FIG. 4 is a schematic drawing of a clock generator circuit that provides a three phase clock signal with a constant delay between each clock phase.

Turning to FIG. 4, there is shown a three phase clock generator circuit 401. A reference frequency 402 is applied to a phase comparator 403 which also receives the output of a fifteen LNL inverter VCO 450 comprising LNL inverters 416–430. Each inverter 416–430 is the same as the inverter 10 of FIG. 1A. The phase comparator 403 outputs a phase error signal 404 to a compensation filter 405. LNL exclusive nor elements 431, 432, 433 are attached to inverters 416 and 419, 421 and 424, 426 and 429, respectively, to generate three non-overlapping clock phases signals Φ1, Φ2, Φ3. A LNL nor/or element 434, similar to NOR/OR gate 20 of FIG. 1B, provides a further clock signal that is six times the frequency of the reference frequency.

Figure 5:
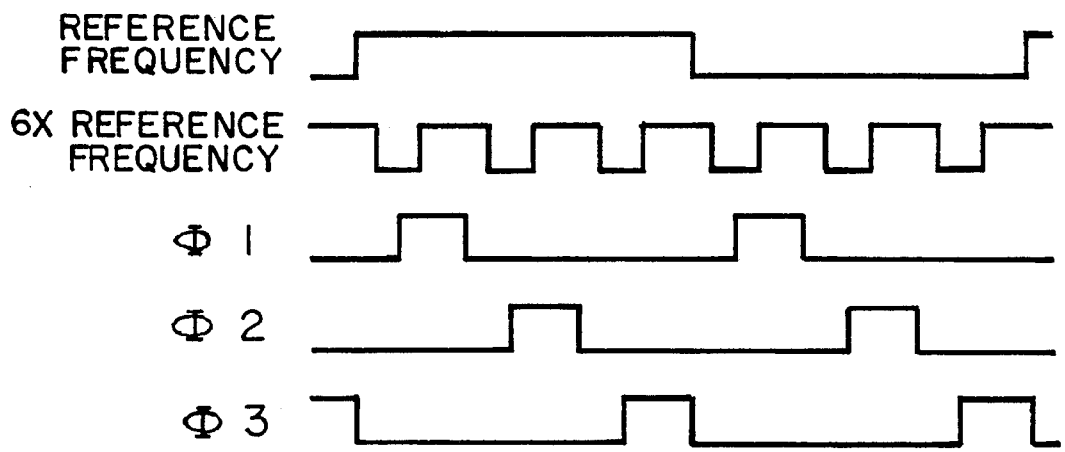
FIG. 5 is graphical representation of the input and output signals of the clock generator of FIG. 4.

The circuit 401 provides a phase locked loop that forces the fifteen inverter VCO 450 to phase lock to the reference frequency input 402. This circuit 401 assures that the delay of the LNL elements 416–430 will have a predictable relationship to the reference frequency 402. This relationship will require that 15 $t_{PD0}$ and 15 $t_{PD1}$ delays will occur in exactly one period of the reference frequency. If the phase locked loop of 401 can be designed to have a high gain so the phase difference between the two wave forms will be very small. LNL exclusive nor elements 431, 432, 433 examine the logic level at their attachment points to the VCO 450. While an oscillator transition is between the attachment points, the exclusive nor output will be high, thereby failing the exclusive nor test. While the oscillator transition is circulating outside of the exclusive nor attachment points, the nor outputs Φ1, Φ2, Φ3 pass the exclusive NOR test and the outputs are low. The Φ1, Φ2, Φ3 outputs operate at twice the frequency as the reference frequency. The relationship between the phases Φ1, Φ2, Φ3 and the reference signal 402 is shown in FIG. 5. The LNL 2-input nor/or 434 examines the outputs of the three exclusive nor elements 431. 432. 433 and outputs a frequency that is six times the frequency of the reference frequency. In circuit 401 all of the LNL elements use the same control voltage Vbias as the VCO 450 uses. That connection has been omitted for purposes of clarity of explanation. Since Vbias originates in the PLL of circuit 401 and is used to adjust the frequency of the VCO 450, using the same Vbias in the exclusive nor 431, 432, 433 and the nor/or 434 insures constant phase relationships between the three phases Φ1, Φ2, Φ3 and insures break before make action between the clock phases.

Figure 6:
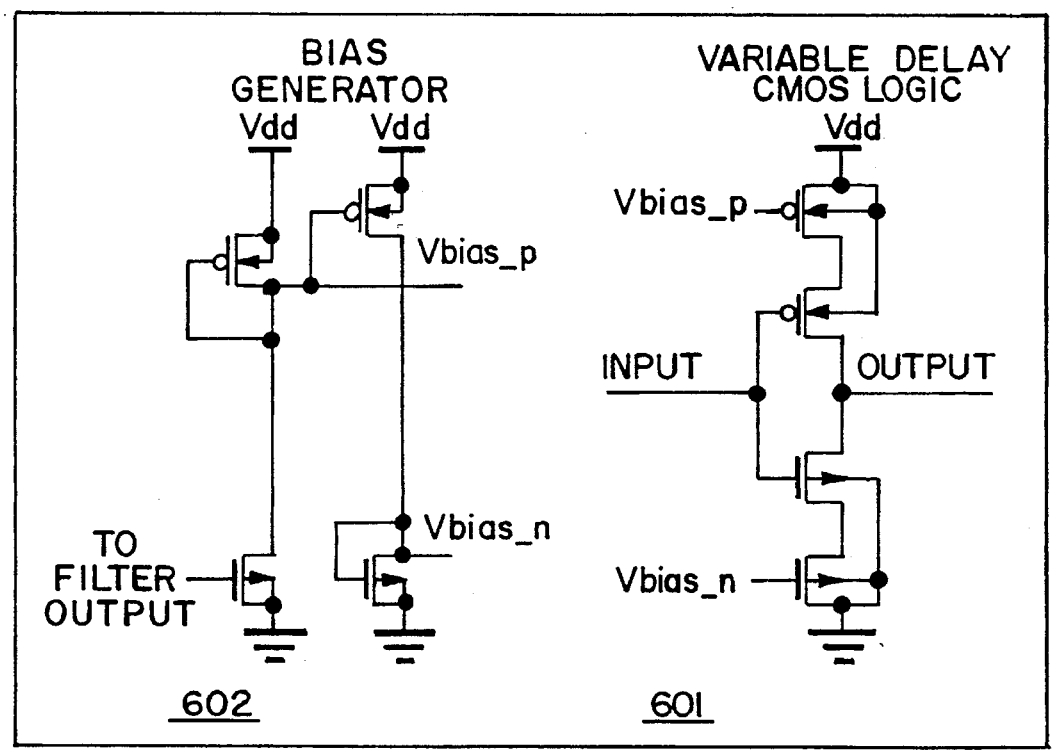
FIG. 6 is schematic representation of an alternate embodiment for building a CMOS variable delay logic element.

It is also noted that the invention is not restricted to the use of LNL logic elements in the development of constant delay logic system and components. An alternate embodiment of the invention uses CMOS logic for a bias generator and for delay logic elements. With reference to FIG. 6 there is shown a CMOS variable delay logic inverter 601 and a CMOS bias generator 602. A CMOS inverter 601 can be substituted for each of the inverters 416–430 of clock circuit 401. The CMOS bias generator 602 can be coupled between the filter 405 and the inverters 601 to provide the bias voltage to each of the inverters 601. It will be noted that the inverter 601 differs from standard CMOS inverters by the use of bias input sources for the respective PMOS and NMOS transistors. The input bias sources provide a constant current source for the inverter 601 that behaves with a known delay. That delay will remain constant so long as the voltages Vbias-p and Vbias-n are constant. Those voltages are kept constant by the PLL of clock circuit 401.

Those skilled in the art will recognize that further embodiments, combinations and modifications of the disclosed invention can be made without departing from the spirit and scope of the appended claims. For example, one further application of the invention may be used to make an asynchronous precision digital delay line. The n state LNL VCO, in a PLL Vbias supply, will be controlled so that n $t_{PD0}$ and n $t_{PD1}$ delays will occur in exactly the period of the Reference Oscillator shown in FIG. 2, n must always be odd. The sum of n $t_{PD0}$ and n $t_{PD1}$ will be maintained constant.

$$t_{PD0} + t_{PD1} = \frac{1}{n*(f_{reference})} \quad (19)$$

The ratio of n $t_{PD0}$ to n $t_{PD1}$ will not be controlled by the PLL control system, however; this ratio remains essentially constant over the operating environment. An asynchronous precision digital delay line could be constructed with delay taps at every second inverter output. These taps should be buffered to avoid loading effects changing the delay of succeeding taps. The asynchronous precision digital delay line would require no termination consideration as is required in an LC delay line.

Another application for constant delay logic is the placement of a critical strobe. The placement of a strobe may be crucial for the operation of a system. The position, in time, of a strobe, over the environmental operating conditions may be assured by using constant delay logic. With respect to a known time position, the initiation of a signal into a precision asynchronous digital delay line, the leading edge of the strobe may be defined to be $$\text{Strobe Position} = \frac{2*m}{n*(f_{reference})} \quad (20)$$

where m is the number of LNL inverter pairs in the strobe delay, n is the number of inverters in the PLL VCO and $f_{reference}$ is the frequency of the Reference Oscillator shown in FIG. 2.

Another application is found in the generation of complex, highly accurate, clock signals that are insensitive to variations in the operating environment. Such clock supply circuits could be made as discrete circuit components as part of a personal computer chip support set or be incorporated into one or more devices in a personal computer. This application also has the capability of providing multiphase complex waveform clocks operating at the reference oscillator frequency (refer to FIGS. 4,5) and a single phase clock that is an even multiple of the reference oscillator frequency.

Complex timing generators could benefit from constant delay logic by gating directly from various stages of the VCO in the PLL. In such a timing generator, the phased locations of the various signal components would remain essentially constant.

Constant delay logic is an ideal candidate for on-chip one-shots. The large uncertainty of pulse width in this application could be removed and a predetermined pulse width could be assured through the use of constant delay logic coupled with a PLL based Vbias supply. On chip one-shots are usually dangerous since the minimum delay is set by the smallest delay attributed to the circuits being employed. The minimum delay is constantly becoming smaller with time as a semiconductor manufacturing process is improved, therefore; eventually a design that was safe yesterday may fail in a lot manufactured at a more recent time.

An on chip one-shot made with LNL elements using a PLL based Vbias supply will not see a variation in pulse width of more than a few percent with processing changes. The variations, if any, will be the difference between $t_{PD0}$ and $t_{PD1}$.

We claim:

1. A constant delay logic element with an input for receiving an input signal and an output for outputting an output signal comprising:

a single constant current source, switching transistors coupled to the current source, inputs coupled to the switching transistors for applying input signals to the switching transistors, current load devices coupled to the switching transistors, outputs coupled to the load devices for outputting signals from the load devices, said switching transistors steering current among said load devices in accordance with the input signals applied to said switching transistors, means, coupled to the constant current source, for controlling the magnitude of the constant current, means responsive to the magnitude of the constant current for delaying the propagation of a signal from the input to the output inversely proportional to the magnitude of the constant current, whereby said propagation delay is determined by the current source.

2. A constant delay logic element with an input for receiving an input signal and an output for outputting an output signal comprising:

a constant current source, switching transistors coupled to the current source, inputs coupled to the switching transistors for applying input signals to the switching transistors, current load devices coupled to the switching transistors, outputs coupled to the load devices for outputting signals from the load devices, said switching transistors steering current among said load devices in accordance with the input signals applied to said switching transistors, means, coupled to the constant current source, for controlling the magnitude of the constant current, means responsive to the magnitude of the constant current for delaying the propagation of a signal from the input to the output inversely proportional to the magnitude of the constant current, and wherein said constant current source has a bias voltage, means responsive to said bias voltage for propagating a signal through said logic element at a speed proportional to said bias voltage, and means for controlling the magnitude of the bias voltage to fix the delay of a signal through said logic element.

3. The logic element of claim 2 wherein the means for controlling the bias voltage comprises a phase locked loop.

4. The logic element of claim 3 wherein the phase locked loop comprises a voltage controlled oscillator having a plurality of said logic elements.

5. The logic element of claim 4 wherein the number of logic elements comprising a voltage controlled oscillator is an odd number.

6. The logic element of claim 3 wherein the phase locked loop comprises a voltage control oscillator, a phase comparator and a reference oscillator wherein said voltage controlled oscillator and said reference oscillator are each coupled to said phase comparator, and wherein the output of the phase comparator provides the bias voltage.

7. A reference voltage generator comprising:

a phase locked loop with a ring oscillator, said ring oscillator comprising a plurality of series connected constant delay logic inverters, all of said constant delay logic inverters coupled to a reference voltage bias source and each inverter having a constant delay dependent upon the magnitude of the reference bias voltage for generating a ring oscillator frequency representative of the reference voltage bias source;

a reference oscillator generating a signal at a reference frequency, a phase comparator for comparing the frequency of the ring oscillator and the frequency of the reference oscillator and generating a phase comparator output signal representative of said comparison between the reference frequency and the ring oscillator frequency, a loop filter coupled to the phase comparator output signal for filtering the output signal of the phase comparator to provide a filtered output signal representative of the difference in frequency between the ring oscillator and the reference oscillator, and an amplifier coupled to the output of the loop filter for generating the reference voltage bias source.

8. A constant delay logic system comprising:

a first plurality of logic elements, each logic element coupled to a voltage bias and each logic element having a delay time inversely proportional to the magnitude of the voltage bias;

a phase locked loop comprising a voltage controlled oscillator having a second plurality of logic elements, each of said second plurality of logic elements having a delay time inversely proportional to the magnitude of the voltage bias and for oscillating at a frequency determined by the delay times of the second plurality of logic elements, a reference oscillator for oscillating any reference frequency, comparing means, coupled to the voltage controlled oscillator and the reference oscillator, for comparing the frequency of the voltage controlled oscillator to the frequency of the reference oscillator, means responsive to said comparing means and coupled to said comparing means and the voltage controlled oscillator for providing a voltage bias signal to the voltage controlled oscillator for operating the voltage controlled oscillator at a frequency corresponding to the frequency of the reference oscillator; and means for coupling the voltage bias signal to the first plurality of logic elements.

9. A clock signal generator comprising a phase locked loop with a voltage controlled oscillator comprising an odd plurality of series connected inverters wherein each inverter has a delay dependent upon an applied bias voltage and means for comparing a reference frequency to the frequency of the voltage controlled oscillator to generate a said bias voltage; means coupled to a first pair of said inverters for generating a first output clock signal and means coupled to a second pair of said inverters for generating a second output clock signal displaced in phase from said first clock signal.

10. The clock signal generator of claim 9 wherein said first and second clock signals have the same frequency.

11. The clock signal generator of claim 9 comprising means coupled to a third pair of inverters for generating a third output clock signal displaced in phase from said first and second clock signals and having the same frequency as said first and second clock signals.

12. A clock signal generator comprising an odd plurality of series connected inverters wherein each inverter comprises a current steering circuit, a constant current source, a bias voltage source for controlling a constant delay dependent upon the bias voltage.

\* \* \* \* \*